US010048316B1

(12) United States Patent
Coutts et al.

(10) Patent No.: US 10,048,316 B1
(45) Date of Patent: Aug. 14, 2018

(54) ESTIMATING TIMING SLACK WITH AN ENDPOINT CRITICALITY SENSOR CIRCUIT

(71) Applicant: QUALCOMM Incorporated, San Diego, CA (US)

(72) Inventors: Ryan Michael Coutts, Carlsbad, CA (US); Samy Shafik Tawfik Zaynoun, San Diego, CA (US); Paul Ivan Penzes, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/492,689

(22) Filed: Apr. 20, 2017

(51) Int. Cl.
*G01R 31/28* (2006.01)
*G01R 31/317* (2006.01)
*G06F 1/10* (2006.01)
*G06F 1/08* (2006.01)

(52) U.S. Cl.
CPC ........ *G01R 31/31725* (2013.01); *G06F 1/08* (2013.01); *G06F 1/10* (2013.01)

(58) Field of Classification Search
CPC ........ G01R 31/31725; G06F 1/08; G06F 1/10
See application file for complete search history.

(56) References Cited

U.S. PATENT DOCUMENTS

| | | | |
|---|---|---|---|
| 6,874,097 B1 * | 3/2005 | Aliahmad | G06F 1/10 375/355 |
| 6,983,394 B1 | 1/2006 | Morrison et al. | |
| 7,424,650 B1 * | 9/2008 | Sivadasan | G01R 31/31725 714/700 |
| 7,442,139 B2 * | 10/2008 | Kubo | B65G 23/06 474/152 |
| 7,523,365 B2 * | 4/2009 | Aldereguia | G11B 20/10009 375/224 |
| 7,555,668 B2 * | 6/2009 | Murtagh | G06F 13/161 713/401 |
| 7,759,980 B2 * | 7/2010 | Kao | H03K 5/1534 326/38 |
| 7,818,705 B1 | 10/2010 | Hutton et al. | |
| 8,169,842 B2 * | 5/2012 | Lee | G11C 29/02 365/189.07 |
| 8,205,182 B1 | 6/2012 | Zlatanovici et al. | |

(Continued)

OTHER PUBLICATIONS

International Search Report and Written Opinion—PCT/US2018/019696—ISA/EPO—dated Jun. 6, 2018.

*Primary Examiner* — Esaw T Abraham
(74) *Attorney, Agent, or Firm* — Colby Nipper/Qualcomm (57) ABSTRACT

Various aspects of this disclosure describe measuring timing slack using an endpoint criticality sensor on a chip. A sensor circuit is attached to sensitive endpoints on the chip (e.g., logical gates in a timing critical path) so that the sensor circuit receives the endpoint's data signal and clock signal. The sensor circuit introduces skew between the data signal and the clock signal by delaying the data signal more than the clock signal, and compares skewed data signals to determine if an error occurs because of the induced skew. By delaying the data signal with different delay amounts and monitoring what delays cause errors, an amount of timing slack in the data signal and clock signal (e.g., margin to criticality) is measured during operation of the chip for relevant circuitry to the system implemented on the chip, compared to test circuitry operating while the chip is in a test mode.

30 Claims, 8 Drawing Sheets

(56) References Cited

U.S. PATENT DOCUMENTS

| | | | | |
|---|---|---|---|---|
| 8,305,368 | B2* | 11/2012 | Chen | G09G 3/3685 |
| | | | | 345/204 |
| 8,422,590 | B2* | 4/2013 | Leibowitz | H03K 5/133 |
| | | | | 375/219 |
| 8,497,704 | B2* | 7/2013 | Singh | H03K 19/17764 |
| | | | | 326/38 |
| 8,578,310 | B2 | 11/2013 | Kalafala et al. | |
| 8,671,374 | B2 | 3/2014 | Ono | |
| 8,842,794 | B2* | 9/2014 | Bae | H03K 19/0966 |
| | | | | 375/219 |
| 8,887,120 | B1 | 11/2014 | Verma et al. | |
| 9,490,030 | B2* | 11/2016 | Kang | G11C 7/1066 |
| 2003/0006750 | A1 | 1/2003 | Roberts et al. | |
| 2005/0147197 | A1 | 7/2005 | Perrott | |
| 2011/0187433 | A1 | 8/2011 | Baumann et al. | |
| 2016/0118966 | A1 | 4/2016 | Chowdhury et al. | |

* cited by examiner

ESTIMATING TIMING SLACK WITH AN ENDPOINT CRITICALITY SENSOR CIRCUIT

BACKGROUND

Field of the Disclosure

The present disclosure relates to non-invasively measuring timing slack on a computer chip when the chip is operating, rather than when the chip is in a test mode.

Description of Related Art

When computer chips are fabricated, great effort is made to ensure adequate timing margin on all paths, and that all transistors receive adequate voltage levels. For instance, static timing analysis can be used to statistically determine a minimum allowable clock frequency at a minimum allowable voltage for the chip. In practice when the chip is operating, however, rarely does a worst-case timing condition exist simultaneously with a worst-case voltage. As a result, the chip is designed with excess margin so that it operates under a variety of conditions. This excess margin results in wasted power when the chip is operating.

One method of reducing the excess margin is to include test circuitry on the chip, such as logic gates that communicate with each other in a single timing path, and to place the chip on a tester during manufacture. During manufacture, while the chip is on the tester, clock frequencies and voltages can be reduced for the logic gates until failure occurs to determine the excess margin. However, such testing adds extra cost to the manufacturing process and is done in a test mode, rather than in an operating mode of the chip, such as when used by an end consumer. Furthermore, the added test circuitry does not well represent the system implemented on the chip, and therefore usually does not indicate the actual margin to criticality (e.g., when the chip will fail due to lowering a voltage or clock frequency) for the system implemented on the chip.

Another method of reducing the excess margin is to include additional test circuitry, such as a ring oscillator, that can be used to control a voltage on the chip during operation of the chip. However, such ring oscillators usually do not well describe the system implemented on the chip, can be specific to the process used to fabricate the chip, and can suffer from wafer and chip variations. Furthermore, such added ring oscillators are rarely worst-case voltage or critical timing paths for the system implemented on the chip, and therefore do not give a good indication of margin remaining to criticality.

Other methods of reducing the excess margin lower voltages or clock frequencies on the chip during operation (e.g., while processing payload data) until failure occurs. However, such methods are invasive and adversely affect the operation of the chip by causing it to fail during operation.

SUMMARY

This summary is provided to introduce a selection of concepts in a simplified form that are further described below in the detailed description. This summary is not intended to identify key features or essential features of the claimed subject matter.

In one or more implementations, a circuit for estimating timing slack on a chip is described. The circuit comprises connections for receiving a data signal and a clock signal of a logical gate included on the chip. The circuit also comprises at least one buffer cell configured to skew the data signal and the clock signal by delaying the data signal more than the clock signal. The circuit also comprises at least one error circuit coupled to a respective one of the at least one buffer cells and configured to determine, for the respective buffer cell, whether a data error has occurred by comparing a delayed data signal output from the respective buffer cell with an additional data signal that is delayed less than the delayed data signal output from the respective buffer cell. The circuit also comprises at least one data collection circuit coupled to a respective one of the at least one error circuits and configured to calculate a respective error indicator for the respective buffer cell based on the determination of the data error for the respective buffer cell. The circuit also comprises a slack estimator circuit configured to receive each error indicator and, based thereon, estimate an amount of timing slack between the data signal and the clock signal of the logical gate.

In one or more implementations, a method of estimating timing slack on a chip is described. The method comprises receiving, with a sensor circuit included on the chip, a data signal and a clock signal of a logical gate included on the chip. The method also comprises skewing, with at least one buffer cell of the sensor circuit, the data signal and the clock signal by delaying the data signal more than the clock signal. The method also comprises determining, for each buffer cell of the at least one buffer cell, whether a data error has occurred by comparing a delayed data signal output from the buffer cell with an additional delayed data signal that is delayed less than the delayed data signal output from the buffer cell. The method also comprises calculating, with a respective data collection circuit corresponding to each buffer cell, a respective error indicator for each buffer cell based on the determination of the data error for each buffer cell. The method also comprises estimating an amount of timing slack between the data signal and the clock signal of the logical gate from the respective error indicator for each buffer cell.

In one or more implementations, a system is described. The system comprises a chip having a logical gate provided with a data signal and a clock signal. The system also comprises a plurality of buffer cells each configured to skew the data signal and the clock signal by delaying the data signal more than the clock signal. The system also comprises a plurality of error circuits each coupled to a respective one of the plurality of buffer cells configured to determine for the respective buffer cell whether a data error has occurred by comparing a delayed data signal output from the respective buffer cell with an additional data signal that is delayed less than the delayed data signal output from the respective buffer cell. The system also comprises a plurality of data collection circuits each coupled to a respective one of the plurality of error circuits configured to calculate a respective error indicator for the respective buffer cell based on the determination of the data error for the respective buffer cell. The system also comprises a slack estimator circuit configured to receive each error indicator and based thereon estimate an amount of timing slack between the data signal and the clock signal of the logical gate.

In one or more implementations, a device for estimating timing slack on a chip is described. The device comprises means for receiving a data signal and a clock signal of a logical gate included on the chip. The device also comprises means for skewing the data signal and the clock signal to produce a plurality of skewed data signals. The device also comprises means for determining, for each skewed data signal, whether a data error has occurred by comparing the skewed data signal with an additional data signal that is skewed less than the skewed data signal. The device also comprises means for calculating a respective error indicator for each skewed data signal, the calculating based on the determination of the data error for each skewed data signal. The device also comprises means for estimating an amount of timing slack between the data signal and the clock signal of the logical gate from the respective error indicator for each skewed data signal.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF DRAWINGS

The detailed description references the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Computer chips (e.g., application specific integrated circuits (ASICs), semiconductor chips, and the like) are fabricated with excess margin, since timing paths are usually closed with a minimum allowable clock frequency at a minimum allowable voltage for the chip. When the chip is operating, however, rarely does a worst-case timing condition exist simultaneously with a worst-case voltage, resulting in the chip being designed with excess margin that translates into wasted power.

In contrast to methods that place the chip in a tester during manufacture, during operation use circuitry not representative of the system implemented on the chip, or during operation invasively affect payload processing of the chip, this disclosure describes methods to save power by reducing excess margin on the chip using a sensor circuit connected to endpoints on the chip identified as sensitive. Examples of sensitive endpoints include logical gates having a particular path that is a long path, having multiple fan-out paths, being sensitive to resistive or capacitive loading, and the like. The chip can be fabricated with a plurality of the described sensor circuits at various sensitive endpoints throughout the system implemented on the chip. The sensor circuit receives a data signal and a clock signal for an endpoint logical gate, such as a flip-flop, and delays the data signal and the clock signal through a plurality of buffer cells. Each buffer cell introduces skew between the data signal and the clock signal by delaying the data signal more than the clock signal. By comparing the data signals from different buffer cells (e.g., from adjacent buffer cells in a chain of buffer cells), such as with an exclusive OR (XOR) gate, an error in the data signal caused by the added skew is detected. An amount of slack in the timing margin can be determined by monitoring the outputs of the XOR gates for each buffer cell. The sensor circuit is non-invasive (e.g., it does not affect payload processing, such as by lowering a clock frequency during operation until failure occurs). Rather, the sensor circuit "taps off" the data signal and the clock signal of an endpoint logical device without altering the data signal and the clock signal provided to the endpoint logical device. The measured timing slack can be used in a feedback control loop (e.g., as one component of an error term provided to the feedback control loop) to adjust a clock frequency or a voltage on the chip, thereby reducing power consumed by the chip.

In the following discussion, example test systems including example circuits for non-invasively measuring timing slack during chip operation are described. Techniques that elements of the example system may implement, and a device on which elements of the example system may be embodied, are also described. Consequently, performance of the example procedures is not limited to the example system and the example system is not limited to performance of the example procedures. Any reference made with respect to the example system, or elements thereof, is by way of example only and is not intended to limit any of the aspects described herein.

Example Environment

Figure 1:
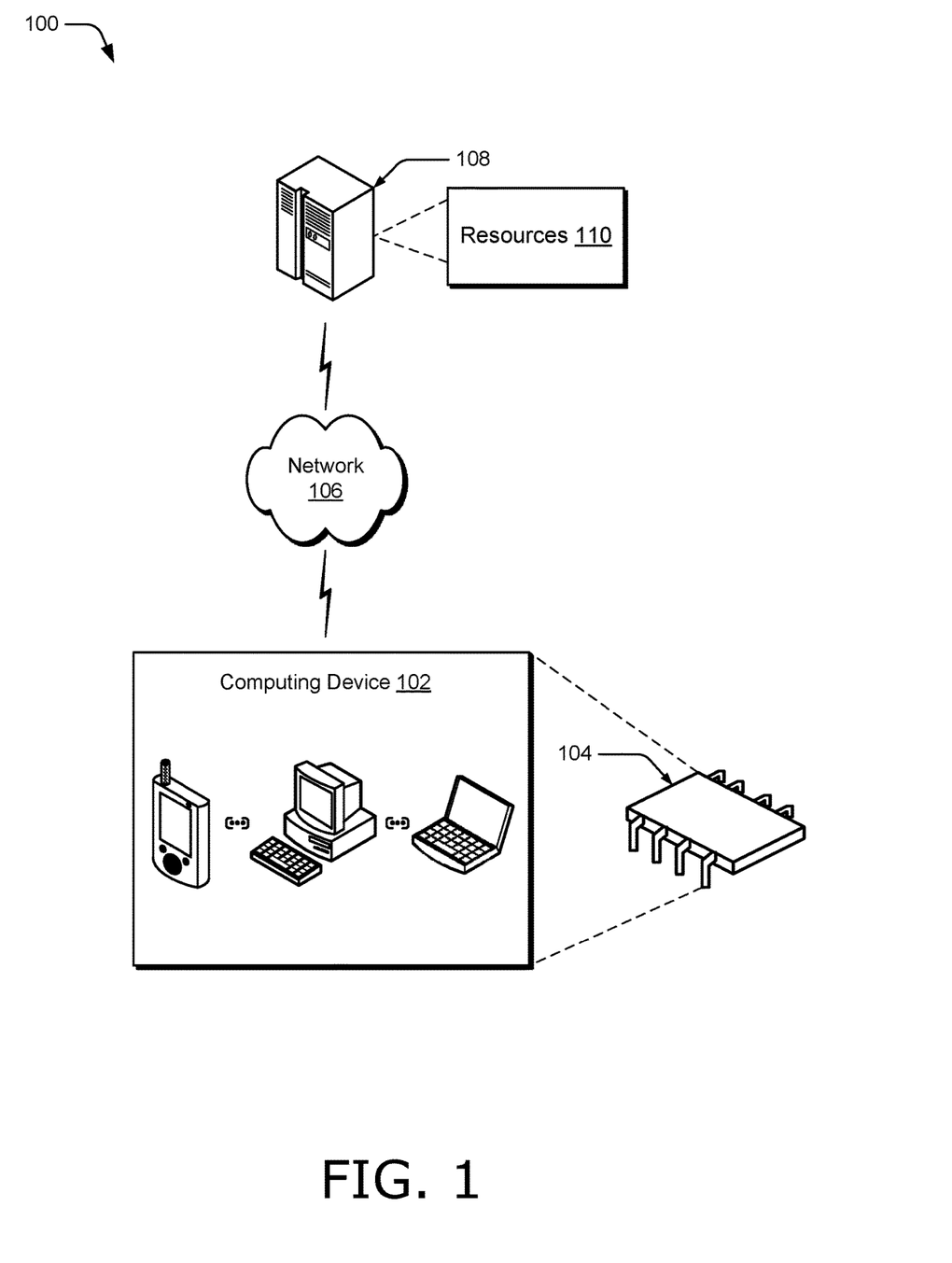
FIG. 1 illustrates an example environment in accordance with one or more aspects of the disclosure.

FIG. 1 illustrates example environment 100 in accordance with one or more aspects of the disclosure. The example environment 100 includes a computing device 102. The computing device 102 may be configured as any suitable type of computing device. For example, the computing device 102 may be configured as a server, a server farm, a desktop computer, a laptop computer, a workstation, a mobile device (e.g., a handheld configuration such as a tablet or mobile phone), a tablet, a router, a modem, a gateway, a camera, a gaming station, and so forth. Thus, the computing device 102 may range from full resource devices with substantial memory and processor resources (e.g., servers and personal computers) to a low-resource device with limited memory or processing resources (e.g., mobile devices). Additionally, the computing device 102 may be representative of a plurality of different devices, such as multiple devices in a server farm of a service provider, or a single computing device, such as an end-user device.

The computing device 102 is illustrated as including a chip 104. The computing device 102 can also include a variety of other components, not shown in FIG. 1 for simplicity. By way of example and not limitation, the computing device 102 can include one or more processing devices, one or more computer-readable storage media, and various applications (e.g., a web browser which is operable to access various kinds of web-based resources from servers) embodied on the computer-readable storage media and operable via the processing system.

The chip 104 can be any suitable type of chip, such as by way of example and not limitation, a computer chip, semiconductor device, an integrated circuit (IC), an application-specific integrated circuit (ASIC), a field-programmable gate array (FPGA), a logic device, a memory chip, and the like, and may comprise one or more die in one or more packages. For instance, the chip 104 can include both die and a package for the die. Furthermore, the chip 104 can comprise multiple chips, such as a chipset.

Moreover, the chip 104 can implement any suitable functionality, such as by way of example and not limitation, a receiver, a transmitter, a transceiver, a radio, an image processor, a graphics processor, a media processor, a general purpose processor, memory storage, and the like. In one example, the chip 104 comprises a cell phone radio capable of transmitting and receiving radio frequency (RF) signals to enable a wireless phone call between two or more callers.

The example environment 100 also includes network 106 and one or more devices 108 that are communicatively coupled to the computing device 102 via the network 106. For instance, the one or more devices 108 can be one or more service providers configured to make various resources 110 available over the network 106 to clients (e.g., the computing device 102). In some scenarios, users may sign up for accounts that are employed to access corresponding resources from a provider. The provider may authenticate credentials of a user (e.g., username and password) before granting access to an account and corresponding resources. Resources 110 may be licensed, purchased, or may be made freely available, (e.g., without authentication, license, or account-based access). Resources 110 can include any suitable combination of services and content made available over the network 106, such as by way of example and not limitation, a video editing service, a photo editing service, a web development and management service, a collaboration service, a social networking service, a messaging service, an advertisement service, and so forth. Content may include various combinations of assets, including videos, ads, audio, multi-media streams, animations, images, web documents, web pages, applications, device applications, text documents, text messages, drawings, presentations, and the like.

In one example, the one or more devices 108 comprise one or more cell phones, and the network 106 comprises a cellular network that enables a user of the computing device 102 to participate in a conversation (e.g., sharing audio, video, or audio and video) with one or more respective users of the one or more devices 108. The network 106, however, may comprise a variety of networks, including the Internet, an intranet, local area network (LAN), wide area network (WAN), personal area network (PAN), body area network (BAN), cellular networks, terrestrial networks, satellite networks, combinations of networks, and the like, and as such may be wired, wireless, or a combination thereof.

Though illustrated in FIG. 1 separately from the computing device 102, computing device 102 may comprise the network 106 and the one or more devices 108. Furthermore, the one or more devices 108 may also comprise one or more chips similar to the chip 104. Consequently, the techniques and circuits described herein may be practiced on any suitable chip, such as the chip 104 comprising the computing device 102, or a chip comprising the one or more devices 108 or a component of the network 106.

Having considered an example environment 100, consider now a discussion of an example circuit for measuring endpoint criticality.

Example Sensor Circuits

Figure 2:
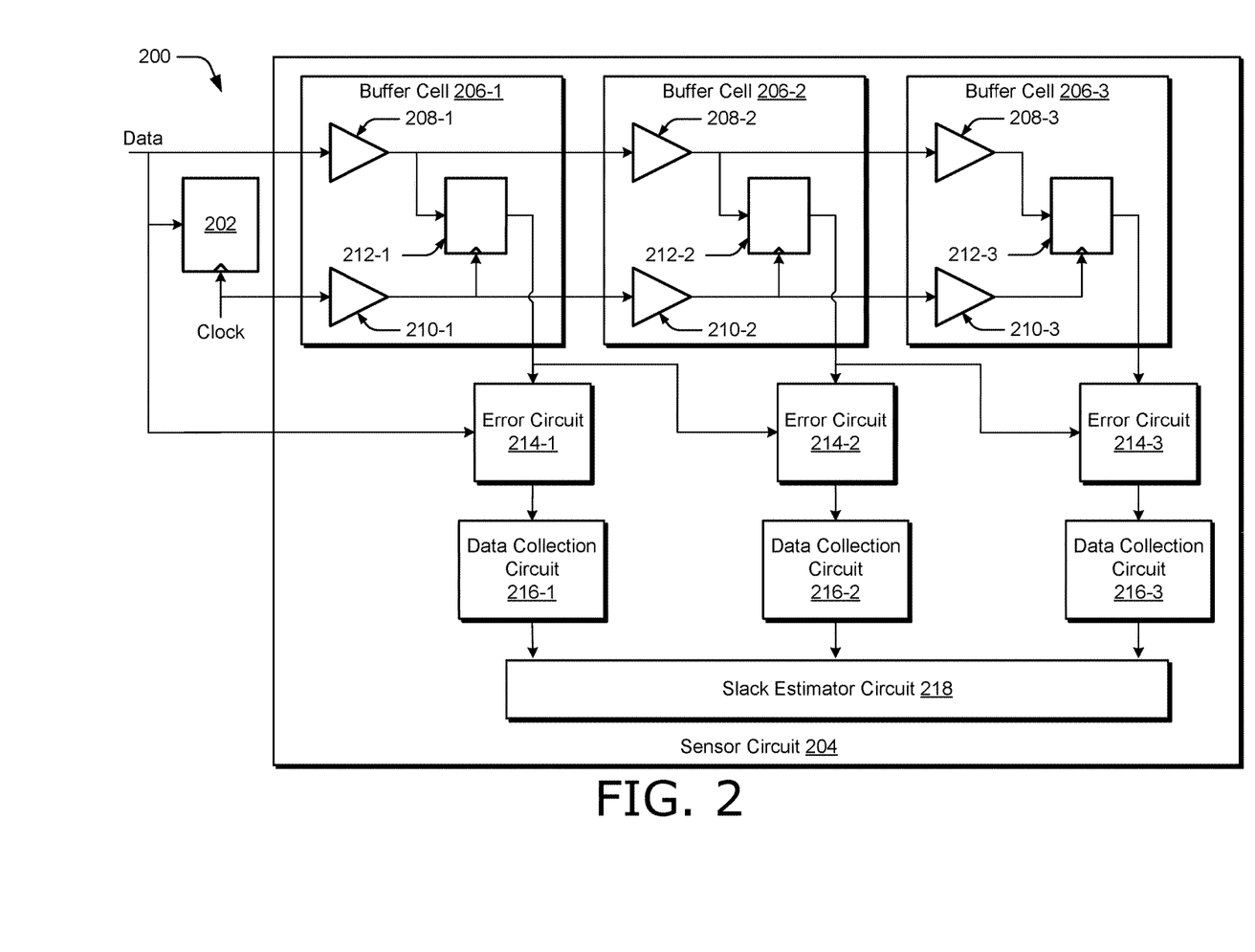
FIG. 2 illustrates an example circuit for measuring endpoint criticality in accordance with one or more aspects of the disclosure.

FIG. 2 illustrates an example circuit 200 for measuring endpoint criticality in accordance with one or more aspects of the disclosure. The example circuit 200 includes a logical gate 202, illustrated as a flip-flop. The logical gate 202 is representative of an endpoint of the system implemented on a chip, such as the chip 104 in FIG. 1, for which timing slack is desired to be measured during operation of the chip (e.g., operating in a functional mode by an end user rather than in a test mode when the chip is on a tester during manufacture). Accordingly, the logical gate 202 may be an endpoint on the chip identified as sensitive during design or manufacture of the chip, such as when timing paths are closed using static timing analysis tools. Sensitive endpoints may include logical gates having a particular path that is a long path, having multiple fan-out paths, being sensitive to resistive loading, being sensitive to capacitive loading, and the like.

The logical gate 202 receives a data signal and a clock signal, such as launched from another flip-flop (not shown). For the data to be properly latched into the logical gate 202, the data signal must arrive to the logical gate 202 before the clock signal (e.g., before a rising edge of the clock signal used to latch the data into the logical gate 202). An amount of timing slack (sometimes referred to as timing margin) is the difference in time from when the latching clock signal arrives to the logical gate 202 and when the data signal arrives to the logical gate 202. For example, suppose a rising edge of a 1 GHz clock signal is used to latch data that takes 900 psec to propagate from a launching flip-flop to the logical gate 202. In this example, the timing slack is the difference between the clock period, 1 nsec, and the data propagation time, 900 psec, yielding 100 psec of timing slack.

To estimate timing slack when the chip is operating, the example circuit 200 includes an example sensor circuit 204 coupled to the data signal and clock signal provided to the logical gate 202 (e.g., via connections on the sensor circuit 204). The sensor circuit 204 uses the data signal and the clock signal to measure an amount of timing slack for the logical gate 202 by inducing skew between the data signal and the clock signal. The sensor circuit 204 operates in a non-invasive way. For instance, the sensor circuit 204 does not change the data signal or the clock signal provided to (e.g., seen by) the logical gate 202. Rather, the sensor circuit 204 receives the data signal and the clock signal provided to the logical gate 202 (e.g., "taps off" the data signal and the clock signal provided to the logical gate 202), and processes the data signal and the clock signal to measure timing slack without affecting operation of the logical gate 202.

The sensor circuit 204 includes buffer cells 206-1, 206-2, and 206-3 (collectively 206). The sensor circuit 204 is illustrated in FIG. 2 with three buffer cells for simplicity. Any suitable number of buffer cells comprising the buffer cells 206 can be used, and the example sensor circuit 204 is illustrated with three buffer cells by way of example, and not limitation. Buffer cell 206-1 comprises a data buffer 208-1 and a clock buffer 210-1. Buffer cells 206-2 and 206-3 contain similar respective data buffers 208-2 and 208-3, and similar respective clock buffers 210-2 and 210-3.

Buffer cell 206-1 receives the data signal provided to the logical gate 202 and delays it with the data buffer 208-1. Buffer cell 206-1 also receives the clock signal provided to the logical gate 202 and delays it with the clock buffer 210-1. The delayed data signal output from the data buffer 208-1 is provided as a data input signal to logical gate 212-1 (illustrated in FIG. 2 as a flip-flop). The delayed clock signal output from the clock buffer 210-1 is provided as a clock input signal to the logical gate 212-1 and used to latch the data into the logical gate 212-1.

Buffer cells 206-2 and 206-3 are configured similarly to buffer cell 206-1. For instance, the buffer cell 206-2 receives a data signal from data buffer 208-1 and delays it with data buffer 208-2, and also receives a clock signal from clock buffer 210-1 and delays it with clock buffer 210-2. The delayed data signal output from the data buffer 208-2 is provided as a data input signal to logical gate 212-2. The delayed clock signal output from the clock buffer 210-2 is provided as a clock input signal to the logical gate 212-2 and used to latch the data into the logical gate 212-2.

Similarly, the buffer cell 206-3 receives a data signal from data buffer 208-2 and delays it with data buffer 208-3, and also receives a clock signal from clock buffer 210-2 and delays it with clock buffer 210-3. The delayed data signal output from the data buffer 208-3 is provided as a data input signal to logical gate 212-3. The delayed clock signal output from the clock buffer 210-3 is provided as a clock input signal to the logical gate 212-3 and used to latch the data into the logical gate 212-3.

Hence, the buffer cells 206 are each configured to introduce skew between the data signal and the clock signal by delaying the data signal more than the clock signal. For instance, each of the buffer cells 206 delays the data signal with a data buffer (e.g., one of the data buffers 208) and also with a logical gate (e.g., one of the logical gates 212). Clock signals, however, are each delayed with one of the clock buffers 210 in each of the buffer cells 206, so that each buffer cell skews the data signal relative to the clock signal. By comparing skewed data signals from adjacent buffer cells, errors in the data signal caused by the skew can be detected. To enable such comparisons, skewed data signals from the logical gates 212 in the buffer cells 206 are provided to respective error circuits. For instance, the skewed data signal output from the logical gate 212-1 in buffer cell 206-1 is provided to error circuit 214-1 and error circuit 214-2, and the skewed data signal output from the logical gate 212-2 in buffer cell 206-2 is provided to error circuit 214-2 and error circuit 214-3. Error circuit 214-3 also receives the skewed data signal output from the logical gate 212-3 in buffer cell 206-3.

The error circuits 214-1, 214-2, and 214-3 (collectively 214) each compare skewed data signals (e.g., from adjacent buffer cells) to determine whether an error in the data has occurred due to the skew introduced in the buffer cells 206. For instance, each of the error circuits 214 compares a delayed data signal output from a respective buffer cell with an additional data signal that is delayed less than the delayed data signal output from the respective buffer cell, such as from a previous buffer cell. The delayed data signal can be a first skewed data signal skewed by a first amount of skew, and the additional data signal can be a second skewed data signal skewed by a second amount of skew different than the first amount of skew. Since for the first buffer cell 206-1 there is no previous buffer cell, the error circuit 214-1 corresponding to the buffer cell 206-1 also receives the data signal provided to the logical gate 202. If there exists a difference in the data signals being compared (e.g., the signals do not match because one or more bits are different in the data signals) by any one of the error circuits 214, a data error is determined by that error circuit. If however, there is no difference in the data signals being compared in an error circuit, a data error is not determined.

Figure 3:
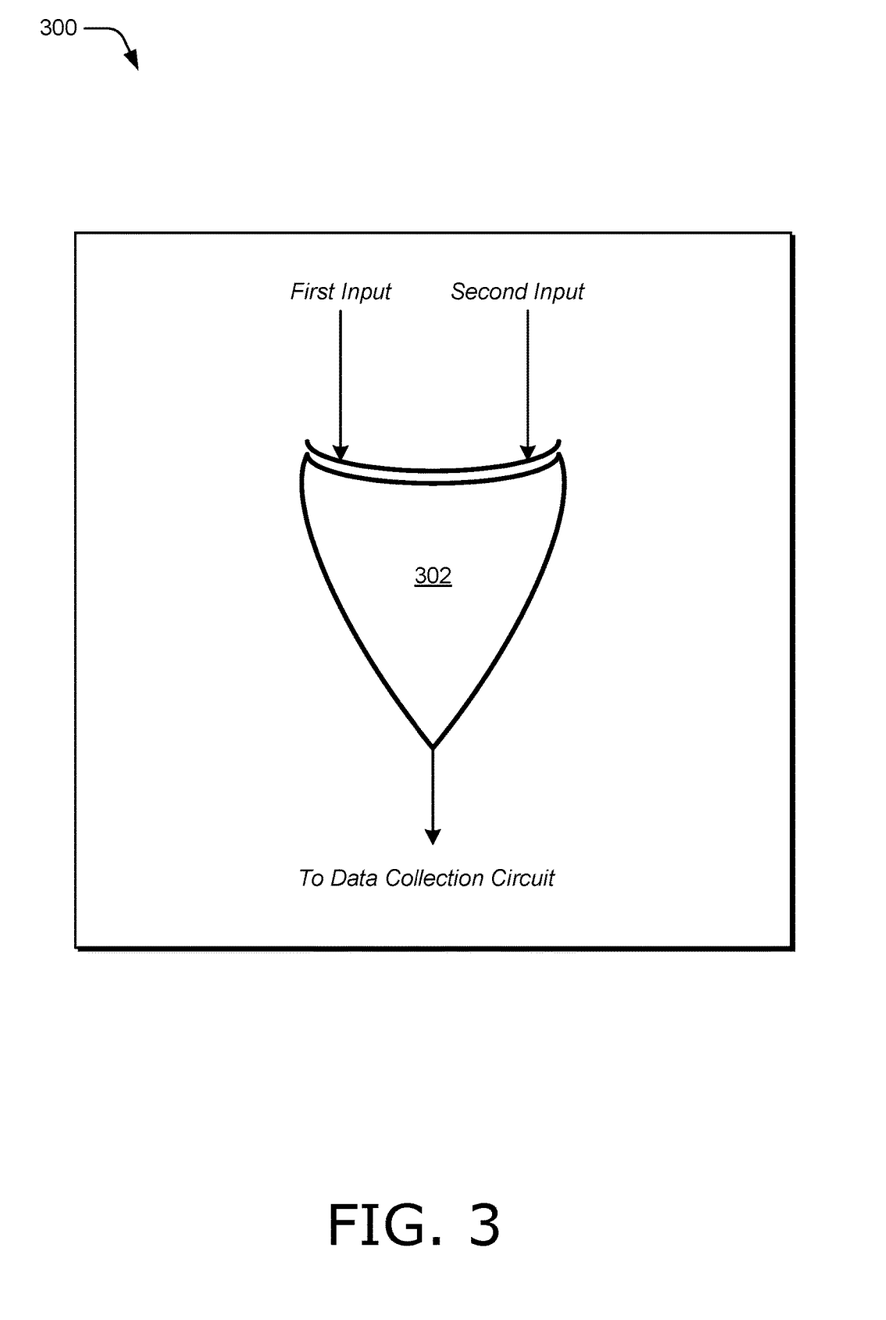
FIG. 3 illustrates an example error circuit in accordance with one or more aspects of the disclosure.

Accordingly, the error circuits 214 can include any suitable circuitry for comparing data signals, such as skewed data signals from different buffer cells, to determine whether an error is present in the data due to the skew introduced in the buffer cells 206. The circuit 300 in FIG. 3 is an example of an error circuit 214 that can be used to determine whether an error is present in the data signal due to skew introduced in the buffer cells 206. Circuit 300 comprises exclusive OR (XOR) gate 302 that accepts a first input and a second input. For instance, a first input can be a skewed data signal from a first buffer cell and a second input can be a skewed data signal from a second buffer cell. The XOR gate indicates an error (e.g., outputs a 1 or high indicator) when the first input is not the same as the second input, and indicates no error (e.g., outputs a 0 or low indicator) when the first input is the same as the second input. Hence, the XOR gate 302 can be used to compare delayed versions of a bit sequence comprising the data signal to indicate when a bit error occurs.

Referring again to FIG. 2, the outputs of the error circuits 214 are provided to respective data collection circuits 216-1, 216-2, and 216-3 (collectively 216). The data collection circuits 216 are each configured to calculate a respective error indicator based on the respective determination of a data error provided by the error circuits 214, and provide the calculated error indicators to a slack estimator circuit 218. For instance, a binary indicator of an error can be provided from each of the error circuits 214 (such as an output of XOR gate 302) to a respective data collection circuit 216, which each calculate an error indicator based on the provided binary indicator. One example of a circuit comprising each of the data collection circuits 216 is an accumulator circuit configured to count binary errors indicated by a respective one of the error circuits 214. In this example, the output of each of the data collection circuits 216 is the value of the accumulator register for that data collection circuit. The accumulator registers can be configured to be cleared upon providing the accumulator values to the slack estimator circuit 218.

Figure 4:
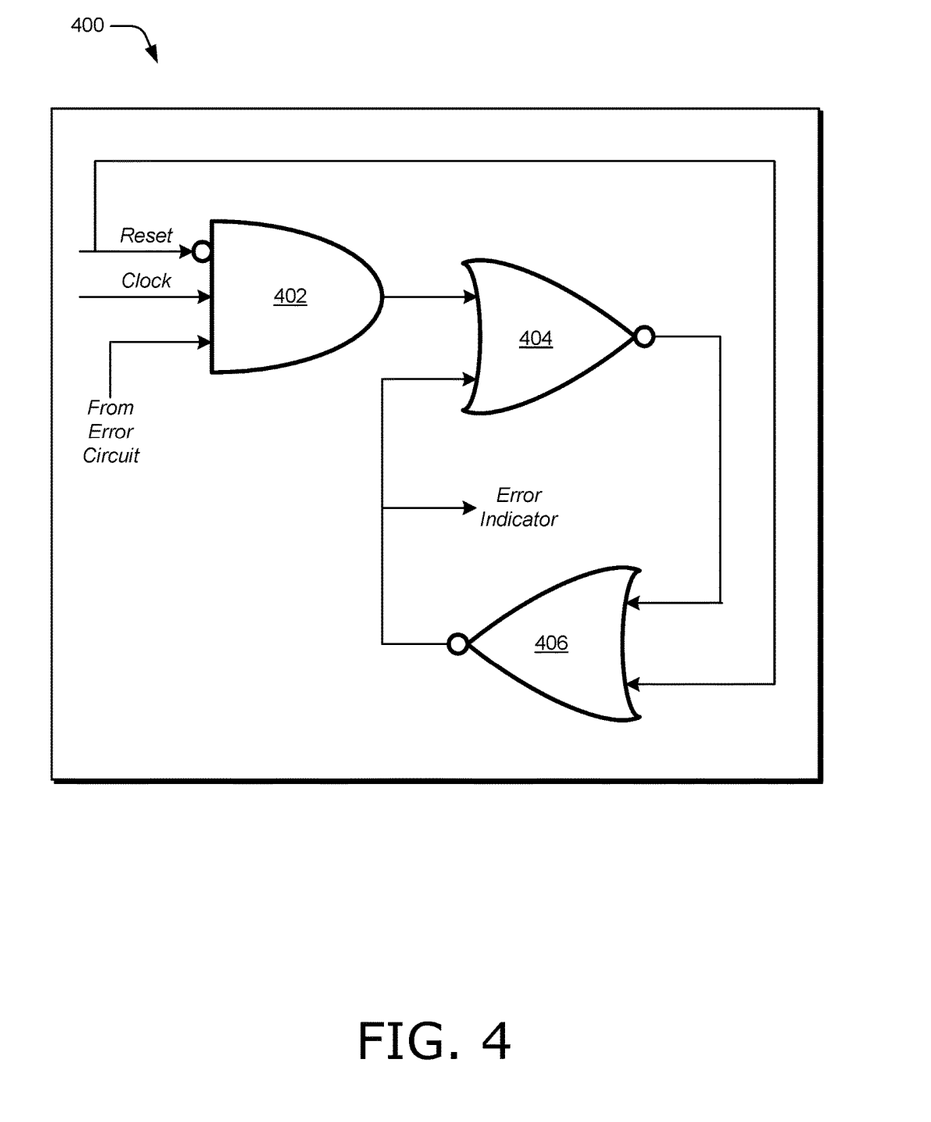
FIG. 4 illustrates an example data collection circuit in accordance with one or more aspects of the disclosure.

Another example of a circuit comprising one or more of the data collection circuits 216 is a sticky bit circuit that sets an error indicator as high (e.g., to indicate an error) once an error is indicated in any bit comprising the data signals compared in a respective one of the error circuits 214. The circuit 400 in FIG. 4 is an example of a sticky bit circuit that can be used in one or more of the data collection circuits 216 to calculate an error indicator. Circuit 400 includes three logical gates, AND gate 402 and first and second NOR gates 404 and 406, respectively. The AND gate 402 receives three inputs, including an inverted reset signal, a clock signal, and a binary error signal from one of the error circuits 214. The reset signal when high is used to reset the circuit 400, and clear the sticky bit. The reset signal can be inverted before it is provided to the AND gate 402, or the AND gate 402 can be provided the reset signal and include an inverting input node.

The clock signal can be any suitable clock signal derived from the clock signal provided to the logical gate 202. In one example, the clock signal provided to the logical gate 202 is delayed by an amount corresponding to a delay of one of the logical gates 212 to produce a clock signal input to the AND gate 402.

The output of the AND gate 402 is provided as a first input to the first NOR gate 404. A second input to the NOR gate 404 is provided from the output of the second NOR gate 406, which also forms the error indicator calculated by the circuit 400 (e.g., the state of the sticky-bit circuit). The output of the first NOR gate 404 is provided as an input to the second NOR gate 406, whose second input comprises the reset signal.

Since the NOR gates produce a high output signal only when both of their respective input signals are low, once an error is indicated in the binary signal from one of the error circuits 214 (e.g., due to a bit mismatch in data signals being compared in the error circuit), the first NOR gate 404 produces a low output which, provided the circuit is not in reset, causes the error indicator in circuit 400 to go high and remain high until the circuit is reset. The error indicator generated by circuit 400 can be provided to the slack estimator circuit 218 in FIG. 2, such as on a block basis (e.g., periodically or at the expiration of a timer) or for every bit processed (e.g., on a sample-by-sample basis). Responsive to providing the error indicator generated by circuit 400 to the slack estimator circuit 218, the reset signal provided to circuit 400 can be asserted high for one or more clock cycles to clear the error indicator in circuit 400.

Referring again to FIG. 2, the error indicators generated by the data collection circuits 216 (e.g., accumulator values, sticky bits, combinations thereof, and the like) are provided to the slack estimator circuit 218. The slack estimator circuit 218 is representative of functionality that estimates an amount of timing slack in the data signal and clock signal provided to the logical gate 202 based on the error indicators from the data collection circuits 216. In one example, the slack estimator circuit 218 is implemented in firmware running on a processor included on a chip comprising the circuit 200.

The slack estimator circuit 218 can include any suitable circuitry to measure timing slack in the data signal and clock signal based on the error indicators from the data collection circuits 216, and may depend on delays of buffers and logical gates comprising the buffer cells 206. For instance, each of the buffer cells 206 can be implemented with buffers having different delays (e.g., that induce different phase shifts). By way of example and not limitation, data buffer 208-1 can be a different type of data buffer (e.g., operating at a different voltage level) with a different delay than data buffer 208-2. Moreover, for each of the buffer cells 206, the data buffers 208 can be implemented with buffers having same or different delays than the clock buffers 210 in the respective buffer cells. For instance, data buffer 208-1 may introduce a same or more phase shift and induce a same or more delay than the clock buffer 210-1 in buffer cell 206-1. Thus, each of the buffer cells 206 can have any suitable delay and induced skew, such as different delays and/or different skews (e.g., different amounts of delay between data and clock signals). Accordingly, the slack estimator circuit 218 depends upon implementation choices of the sensor circuit 204. Furthermore, the slack estimator circuit 218 can use calibration data for delays of buffers to determine an amount of timing slack in units of time (discussed below in more detail with respect to FIG. 7).

Moreover, the slack estimator circuit 218 can be configured to update a histogram counter that maintains a statistical distribution of timing slack by accumulating numbers of times different amounts of timing slack are the estimated amount of timing slack. The histogram can be provided to a feedback control loop on the chip that adjusts a clock frequency or a voltage on the chip based on the histogram, such as to statistically set an amount of timing slack at an endpoint by lowering a clock frequency to achieve a desired probability that the timing slack for the endpoint is an average timing slack determined from the histogram.

In one example, each of the buffer cells comprises a different amount of delay of the data signal than each other buffer cell (e.g., each of data buffers 208 are different types of buffers with different delays). The buffer cells 206 can be placed in any suitable order, such as ascending or descending according to the delay of the buffer cell (e.g., with the buffer cell 206-1 corresponding to a largest or smallest delay and the buffer cell 206-3 corresponding to a smallest or largest delay).

The sensor circuit 204 operates by pushing the clock signal towards the data signal to induce an error for some amount of delay. By monitoring the error indicators from the data collection circuits 216, an estimate of the amount of timing slack (e.g., timing margin remaining to criticality) is measured by the slack estimator circuit 218. For instance, if the data collection circuit 216-3 indicates the presence of errors, and the data collection circuits 216-1 and 216-2 do not indicate the presence of errors, then the timing slack can be estimated from the delay between the logical gate 202 and the buffer cell 206-3. If, on the other hand, the data collection circuit 216-1 indicated the presence of errors, it can be determined that there is no timing slack, or a minimal amount of timing slack (e.g., the logical gate 202 is already operating close to criticality). In this example, the sensor circuit 204 operates as an early warning indicator that little or no timing slack remains for at least one endpoint on the chip.

Since buffers comprising the buffer cells 206 can be implemented with different delays, the buffer cells 206 can be selected to measure different granularities of timing slack. For instance, some buffer cells may be used to measure timing slack in nsec ranges while other buffer cells may be used to measure timing slack in psec ranges.

The sensor circuit 204 measures the timing slack of logical gate 202 in a non-invasive way while the chip is operating. For instance, the operation of the logical gate 202 is unaffected by the sensor circuit 204. Furthermore, the chip can be fabricated with a plurality of the described sensor circuits at various sensitive endpoints throughout the system implemented on the chip. Sensitive endpoints can be determined as sensitive when the chip is designed, such as when timing paths are closed, and can include by way of example and not limitation, logical gates having a particular path that is a long path, having multiple fan-out paths, being sensitive to resistive or capacitive loading, and the like. Consequently, the endpoints for which the described sensor circuits are attached directly correspond to parts of the system on the chip known to be sensitive to timing, and therefore the sensor circuits (e.g., sensor circuit 204) accurately measure timing slack remaining to failure of the system running on the chip during real-world operation. This constitutes an improvement over circuits that run when the chip is in a test mode, rather than an operating mode, or that reduce margins during chip operation using test circuitry implemented on the chip that has little to do with the system implemented on the chip (e.g., the system that processes payload data on the chip).

In one example, the measured timing slack from the slack estimator circuit 218 is supplied to a feedback control loop implemented on the chip. The feedback control loop updates a clock frequency running on the chip based on the estimated amount of timing slack from the slack estimator circuit 218, for example, by lowering the clock frequency and thereby saving power on the chip. Furthermore, a voltage control feedback loop comprising the chip can be used to update (e.g., lower) a voltage on the chip based on the estimated amount of timing slack.

The measured timing slack can be one component of multiple components that comprise an error term used by the feedback control loop implemented on the chip. For instance, data provided from test circuitry, such as a ring oscillator, may be combined with the measured timing slack from the slack estimator circuit 218 to form an error term used to update a clock frequency or voltage on the chip with one or more feedback control loops. Furthermore, the sensor circuit 204 can be used to determine components of timing slack based on different functions. For instance, by using different types of buffers and buffer cells with different delays, the timing slack can be determined to be dependent on different functions, such as low threshold devices, high threshold devices, wire sensitivities, and the like. Thus, the timing slack can be decomposed into components due to each of the different functions. The slack estimator circuit 218 may therefore calculate a plurality of timing slack amounts, each corresponding to a different component contributing to the timing slack (e.g., a high threshold component, a low threshold component, etc.). The feedback control loop implemented on the chip may use one or more of the timing slack amounts calculated by the slack estimator circuit 218 to update a clock frequency or voltage on the chip and manage power.

Having considered a discussion of example circuits 200, 300, and 400, consider now a discussion of example procedures in accordance with one or more aspects of the disclosure.

Example Procedures

Figure 5:
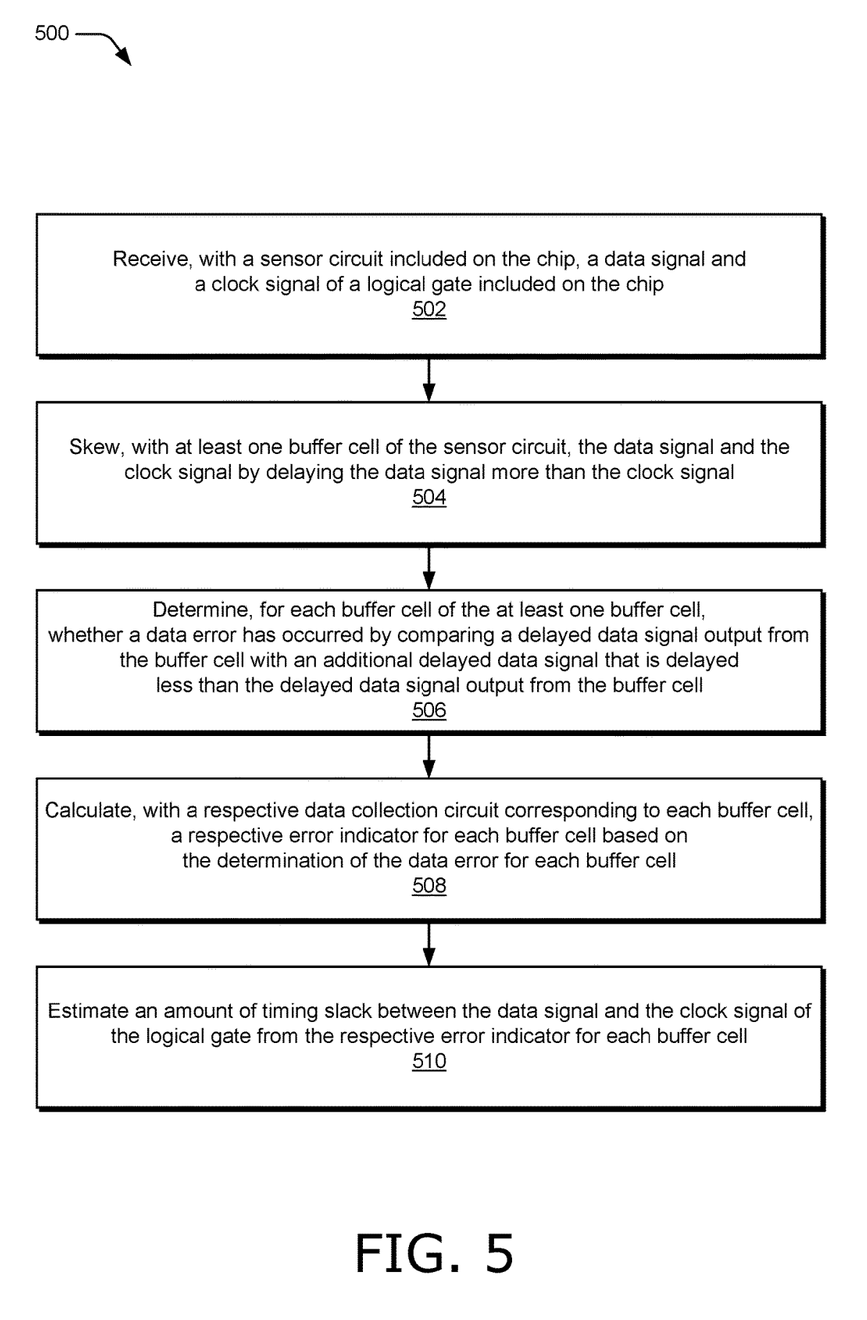
FIG. 5 is a flow diagram depicting an example procedure in accordance with one or more aspects of the disclosure.

FIG. 5 illustrates an example procedure 500 for measuring an amount of timing slack of an endpoint in accordance with one or more aspects. Aspects of the procedure may be implemented in hardware, firmware, or software, or a combination thereof. The procedure is shown as a set of blocks that specify operations performed by one or more devices and are not necessarily limited to the orders shown for performing the operations by the respective blocks. In at least some aspects the procedure may be performed by a suitably configured device or devices, such as the computing device 102 in FIG. 1.

A data signal and a clock signal of a logical gate included on a chip are received with a sensor circuit included on the chip (block 502). For instance, the logical gate can be an endpoint on the chip previously determined to be sensitive to timing slack, such as during design of the chip to close timing paths using static analysis timing tools.

The data signal and the clock signal are skewed with at least one buffer cell of the sensor circuit by delaying the data signal more than the clock signal (block 504). The at least one buffer cell can include a plurality of buffer cells, and each buffer cell can comprise a different amount of delay than other buffer cells. In one example, at least two of the buffer cells comprise a different amount of delay of the data signal than each other.

Each of the buffer cells contain a first buffer for delaying the data signal and a second buffer for delaying the clock signal, and the first buffer and the second buffer can have a same threshold voltage (e.g., be of a same buffer device type). Furthermore, each of the buffer cells can contain a same type of flip-flop as the logical gate.

Each of the buffer cells can be connected to another buffer cell by coupling a buffered data signal and a buffered clock signal between adjacent buffer cells, and to skew the data signal and the clock signal by delaying the data signal more than the clock signal can comprise skewing the buffered data signal more than the buffered clock signal.

For each buffer cell of the at least one buffer cell, it is determined whether a data error has occurred by comparing a delayed data signal output from the buffer cell with an additional delayed data signal that is delayed less than the delayed data signal output from the buffer cell (block 506). Determining, for each buffer cell, whether the data error has occurred can be done with a respective XOR logic gate for each buffer cell.

In one example, the at least one buffer cell comprises a plurality of buffer cells, and for at least one buffer cell, the additional delayed data signal is a delayed data signal output from another buffer cell. For one of the buffer cells (e.g., a first buffer cell in a chain of buffer cells), the additional delayed data signal can be the data signal provided to the logical gate included on the chip. For each respective buffer cell other than the one buffer cell, the additional data signal can be a delayed data signal output from a different buffer cell than the respective buffer cell. The delayed data signal can be a first skewed data signal skewed by a first amount, and the additional data signal can be a second skewed signal skewed by a second amount. The first and second amounts of skew can correspond to different amounts of skew induced by different amounts of delay in data paths and clock paths.

A respective error indicator is calculated for each buffer cell based on the determination of the data error for each buffer cell with a respective data collection circuit corresponding to each buffer cell (block 508). In one example, the respective data collection circuit corresponding to each buffer cell comprises a circuit implementing a respective sticky bit, and the respective error indicator for each buffer cell is a state of the respective sticky bit for each buffer cell. Additionally or alternatively, the respective data collection circuit corresponding to each buffer cell can comprise a respective accumulator circuit that accumulates determined data errors for each buffer cell, and the respective error indicator for each buffer cell is based on a value of the respective accumulator for each buffer cell.

An amount of timing slack between the data signal and the clock signal of the logical gate is estimated from the respective error indicator for each buffer cell (block 510). In one example, the estimated amount of timing slack is based on a delay from the logical gate to a buffer cell having minimum delay to the logical gate and for which a data error is determined.

A histogram counter can be updated that maintains a statistical distribution of timing slack by accumulating numbers of times different amounts of timing slack are the estimated amount of timing slack. The histogram counter can be implemented in hardware, firmware, software, or combinations thereof.

In one example, the steps of procedure 500 are performed while the chip is operating in a non-test mode, such as by an end user.

Figure 6:
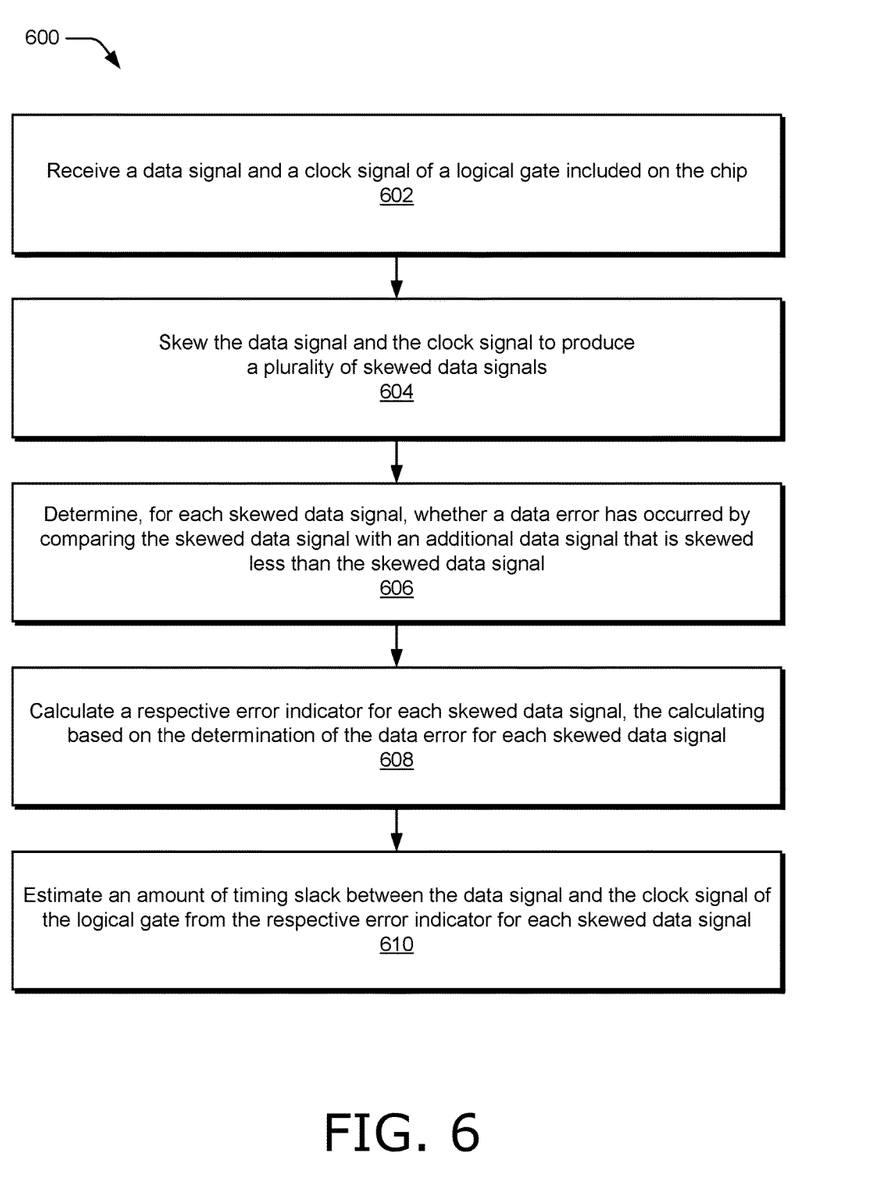
FIG. 6 is a flow diagram depicting an example procedure in accordance with one or more aspects of the disclosure.

FIG. 6 illustrates an example procedure 600 for measuring an amount of timing slack of an endpoint in accordance with one or more aspects. Aspects of the procedure may be implemented in hardware, firmware, or software, or a combination thereof. The procedure is shown as a set of blocks that specify operations performed by one or more devices and are not necessarily limited to the orders shown for performing the operations by the respective blocks. In at least some aspects the procedure may be performed by a suitably configured device or devices, such as the computing device 102 in FIG. 1.

A data signal and a clock signal of a logical gate included on a chip are received (block 602). For instance, the data signal and the clock signal can be "tapped off" non-invasively without affecting the data signal and the clock signal that are provided to the logical gate. The logical gate can be operating in a non-test mode, such as in a functional mode as when included in a device operated by an end user.

The data signal and the clock signal are skewed to produce a plurality of skewed data signals (block 604). The data signal and the clock signal can be skewed using a plurality of buffer cells, each buffer cell delaying a data signal more than a clock signal to produce a skewed data signal. Each skewed data signal can comprise a different amount of skew between the data signal and the clock signal than other skewed data signals.

For each skewed data signal, it is determined whether a data error has occurred by comparing the skewed data signal with an additional data signal that is skewed less than the skewed data signal (block 606). For instance, for at least one buffer cell, the additional data signal is a skewed data signal output from another buffer cell. The data error for each skewed data signal is determined to have occurred if the skewed data signal and the additional data signal do not match (e.g., have a differing bit).

A respective error indicator for each skewed data signal is calculated based on the determination of the data error for each skewed data signal (block 608). In one example, an error indicator is a binary indicator that asserts high once a bit in the skewed data signal does not match a bit in the additional data signal and remains high until cleared, such as a sticky bit. Additionally or alternatively, an error indicator may comprise an accumulator value that counts bit errors between the skewed data signal and the additional data signal.

An amount of timing slack between the data signal and the clock signal of the logical gate is estimated from the respective error indicator for each skewed data signal (block 610). In one example, the estimated amount of timing slack is based on a delay from the logical gate to a buffer cell having minimum delay to the logical gate and for which a data error is determined.

Accordingly, the methods described herein constitute an improvement over methods that place the chip in a tester during manufacture, during operation use circuitry not representative of the system implemented on the chip, or during operation invasively affect payload processing of the chip. The methods described herein save power during chip operation by non-invasively reducing excess margin on the chip with a sensor circuit connected to endpoints on the chip previously identified as sensitive, which are therefore particularly relevant to the system implemented on the chip.

Having considered a discussion of example procedures for measuring timing slack, consider now a discussion of example data for calibrating delays of a sensor circuit that can implement the example procedures.

Example Calibration Data

Figure 7:
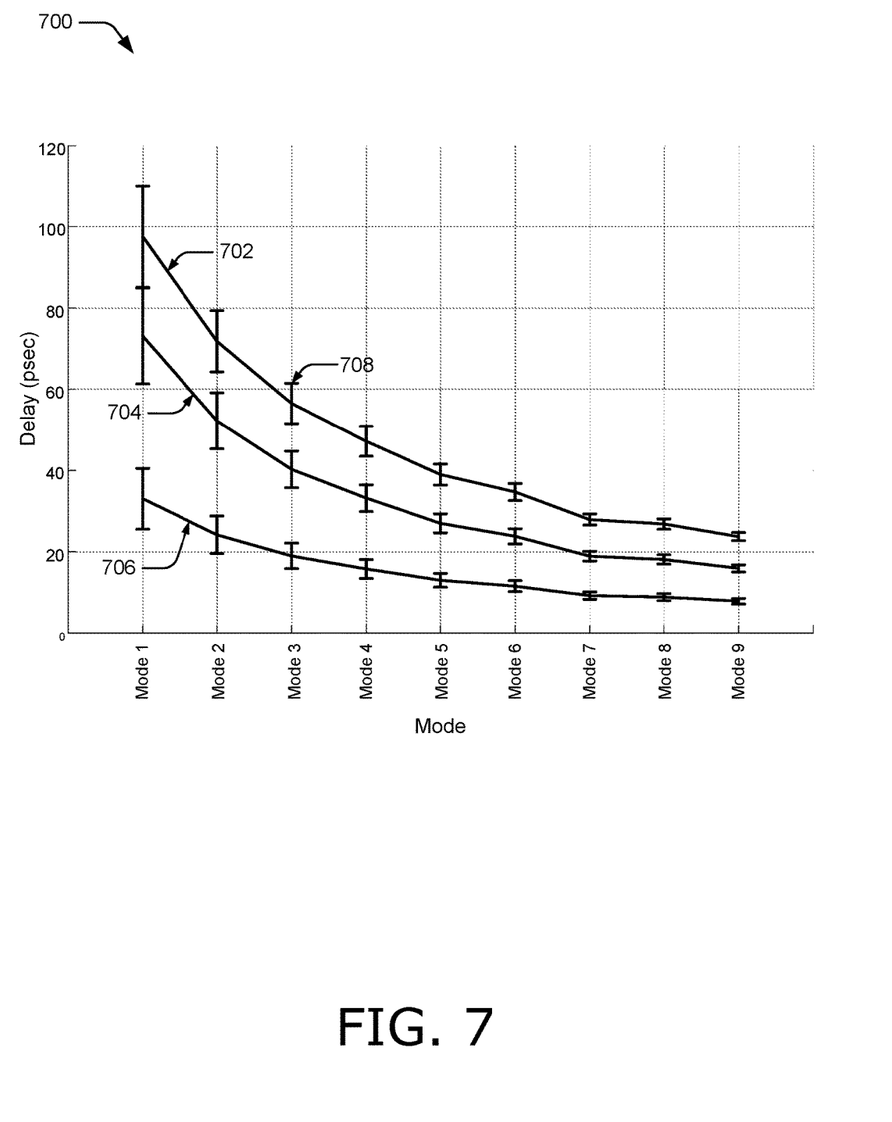
FIG. 7 illustrates example data for calibrating delay in accordance with one or more aspects of the disclosure.

FIG. 7 illustrates example data 700 for calibrating delay in accordance with one or more aspects of the disclosure. Buffers (such as data buffers 208 in FIG. 2) can be of different types and supplied different voltages, so that the delay in units of time (e.g., psec) for signals propagating through the buffers depends on the buffer implementation. Furthermore, different fabrication processes, and variations within a process, can cause variations in the delay of signals propagating through the buffers. Accordingly, an amount of delay for the buffers comprising the buffer cells is calibrated for the process used to fabricate the chip over a variety of different operating modes, such as different voltages supplied to the buffers, and buffer types.

Example data 700 illustrates three curves 702, 704, and 706 which correspond to three types of buffers, a first buffer type, a second buffer type, and a third buffer type, respectively. For example, different buffer types can correspond to different circuit implementations of buffers. The data 700 is computer-generated data based on simulations that use circuit models of buffers for a given chip fabrication process. The curves 702, 704, and 706 plot average delay in psec of the buffers over nine operating modes, labeled Mode 1 . . . Mode 9. In this example, the operating modes include varying a voltage level to the buffers, with Mode 1 corresponding to the lowest voltage level and Mode 9 corresponding to the highest voltage level. Generally, operating modes can include varying any suitable parameter, such as by way of example and not limitation, a voltage level, a clock frequency, combinations thereof, and the like.

Furthermore, for each mode and buffer type, the data points are averaged over multiple temperatures, such as −30, 0, and 125 degrees C. Standard deviation bars for each mode are also included. For instance, one standard deviation of the delay of the first buffer type at Mode 3 is illustrated by the standard deviation bar 708.

During design of the chip, data 700 can be used to configure the sensor circuit 204 in FIG. 2 (e.g., to select how many buffer cells, what types of buffers, and the operating modes for the buffers) to achieve a desired range and granularity for measuring the timing slack. For instance, the delay for each stage of the sensor circuit 204 can be designed using calibration data (e.g., the data 700) so that the slack estimator circuit 218 in FIG. 2 can measure timing slack in a desired range at a desired granularity.

During operation, the slack estimator circuit 218 can use the data 700 to determine an amount of timing slack in units of time. For instance, the slack estimator circuit 218 may determine the timing slack to be the delay through one or more buffer cells (e.g., based on error indicators corresponding to the buffer cells), and use the data 700 to translate the delay through the one or more buffer cells into units of time. Accordingly, the chip may store calibration data (e.g., the data 700), such as in a look-up-table in memory on the chip, or access calibration data, such as from a server over a network.

Having considered a discussion of example data for calibrating delays of buffer cells, consider now a discussion of a device on which aspects of measuring timing slack using an endpoint criticality sensor can be implemented.

Example Device

Figure 8:
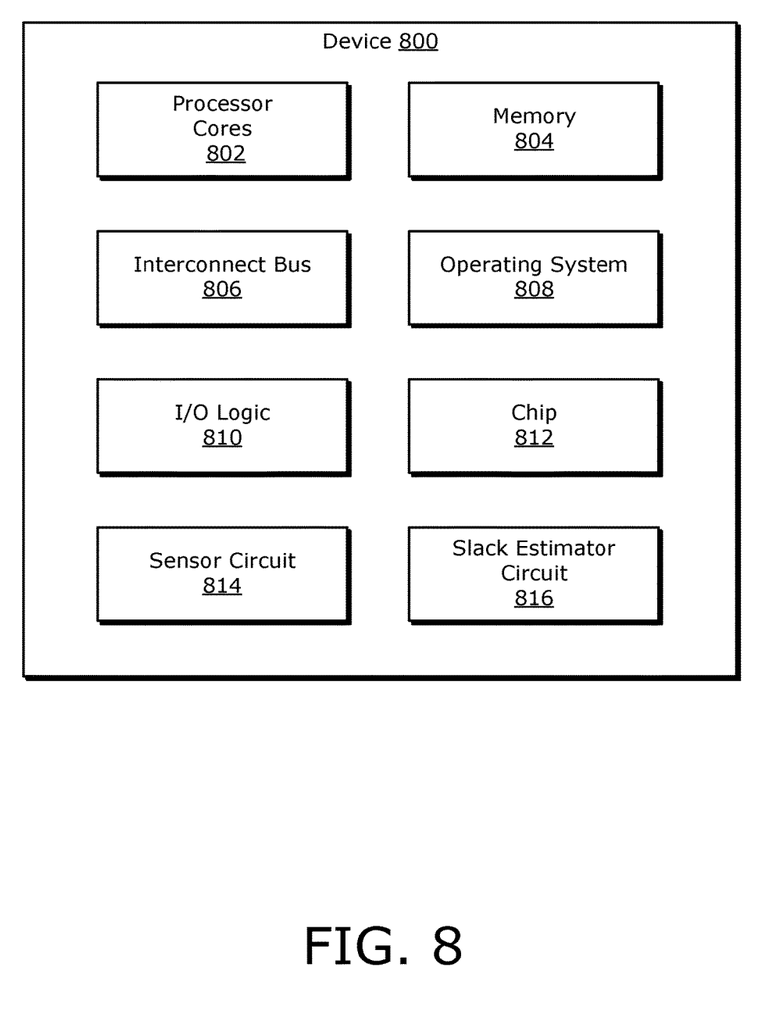
FIG. 8 illustrates an example device that can be employed for one or more implementations described herein.

FIG. 8 illustrates an example device 800, which includes components capable of implementing aspects of measuring timing slack using an endpoint criticality sensor. The device 800 may be implemented as, or in, any suitable electronic device, such as a modem, broadband router, access point, cellular phone, smart-phone, gaming station, laptop computer, net book, set-top-box, household appliance, network-attached storage (NAS) device, cell tower, satellite, cable head-end, work station, testing station, server, test and measurement equipment, combinations thereof, and/or any other device that may contain a chip for which timing slack is desired to be measured during operation. The device 800 can comprise one or more devices, and is illustrated as a single device in FIG. 8 for simplicity. For instance, the device 800 may be implemented on multiple devices connected over a network.

The device 800 may be integrated with a microprocessor, storage media, I/O logic, data interfaces, logic gates, a transmitter, a receiver, circuitry, firmware, software, and/or combinations thereof to provide communicative or processing functionalities. The device 800 may include a data bus (e.g., cross bar or interconnect fabric) enabling communication between the various components of the device. In some aspects, components of the device 800 may interact via the data bus to implement aspects of measuring timing slack using an endpoint criticality sensor.

In this particular example, the device 800 includes processor cores 802 and memory 804. The memory 804 may include any suitable type of memory, such as volatile memory (e.g., DRAM), non-volatile memory (e.g., flash), cache, and the like. In the context of this disclosure, the memory 804 is implemented as a storage medium, and does not include transitory propagating signals or carrier waves. An interconnect bus 806 is used to allow components of the device 800 to interact, such as to access the memory 804. The memory 804 can store data and processor-executable instructions of the device 800, such as operating system 808 and other applications. Processor cores 802 may execute the operating system 808 and other applications from the memory 804 to implement functions of the device 800, the data of which may be stored to the memory 804 for future access. The device 800 may also include I/O logic 810, which can be configured to provide a variety of I/O ports or data interfaces for communication.

The device 800 also includes chip 812. The chip 104 in computing device 102 is an example of the chip 812. The chip 812 can be any suitable type of chip, such as by way of example and not limitation, a computer chip, semiconductor device, an integrated circuit (IC), an application-specific integrated circuit (ASIC), a field-programmable gate array (FPGA), a logic device, a memory chip, and the like, and may comprise one or more die in one or more packages. For instance, the chip 812 can include both die and a package for the die. Furthermore, the chip 812 can comprise multiple chips, such as a chipset.

The device 800 also includes sensor circuit 814. The sensor circuit 204 in FIG. 2 is an example of the sensor circuit 814. The sensor circuit 814 is implemented at least in part on the chip 812. For instance, the sensor circuit 814 may comprise buffer cells, error circuits, and data collection circuits used to skew a data signal relative to a clock signal and detect errors resulting from the induced skew. At least the buffer cells are implemented on the chip 812. In one example, error circuits and data collection circuits comprising the sensor circuit 814 are also implemented on the chip 812.

The device 800 also includes slack estimator circuit 816. The slack estimator circuit 218 in FIG. 2 is an example of the slack estimator circuit 816. The slack estimator circuit 816 is coupled to the sensor circuit 814 and configured to measure timing slack of an endpoint (e.g., a logical gate) on the chip 812 using error indicators provided by the sensor circuit 814. Accordingly, the slack estimator circuit 816 may comprise the sensor circuit 814, and be implemented at least in part on the chip 812. Additionally or alternatively, the slack estimator circuit 816 can be implemented at least in part in firmware running on the processor cores 802.

In one or more exemplary aspects, the functions described may be implemented in hardware, software, firmware, or any combination thereof. If implemented in software, functions may be stored on a computer-readable storage medium (CRM). In the context of this disclosure, a computer-readable storage medium may be any available medium that can be accessed by a general-purpose or special-purpose computer that does not include transitory propagating signals or carrier waves. By way of example, and not limitation, such media can comprise RAM, ROM, EEPROM, CD-ROM or other optical disk storage, magnetic disk storage, or other magnetic storage devices, or any other non-transitory medium that can be used to carry or store information that can be accessed by a general-purpose or special-purpose computer, or a general-purpose or special-purpose processor. The information can include any suitable type of data, such as computer-readable instructions, sampled signal values, data structures, program components, or other data. These examples, and any combination of storage media and/or memory devices, are intended to fit within the scope of non-transitory computer-readable media. Disk and disc, as used herein, includes compact disc (CD), laser disc, optical disc, digital versatile disc (DVD), and Blu-ray disc where disks usually reproduce data magnetically, while discs reproduce data optically with a laser. Combinations of the above should also be included within the scope of computer-readable media.

Firmware components include electronic components with programmable memory configured to store executable instructions that direct the electronic component how to operate. In some cases, the executable instructions stored on the electronic component are permanent, while in other cases, the executable instructions can be updated and/or altered. At times, firmware components can be used in combination with hardware components and/or software components.

The term "component", "module", and "system" are indented to refer to one or more computer related entities, such as hardware, firmware, software, or any combination thereof, as further described above. At times, a component may refer to a process and/or thread of execution that is defined by processor-executable instructions. Alternately or additionally, a component may refer to various electronic and/or hardware entities.

Certain specific aspects are described above for instructional purposes. The teachings of this disclosure have general applicability, however, and are not limited to the specific aspects described above.

What is claimed is:

1. A circuit for estimating timing slack on a chip, the circuit comprising:
   connections for receiving a data signal and a clock signal of a logical gate included on the chip;
   at least one buffer cell configured to skew the data signal and the clock signal by delaying the data signal more than the clock signal;
   at least one error circuit coupled to a respective one of the at least one buffer cells and configured to determine, for the respective buffer cell, whether a data error has occurred by comparing a delayed data signal output from the respective buffer cell with an additional data signal that is delayed less than the delayed data signal output from the respective buffer cell;
   at least one data collection circuit coupled to a respective one of the at least one error circuits and configured to calculate a respective error indicator for the respective buffer cell based on the determination of the data error for the respective buffer cell; and
   a slack estimator circuit configured to receive each error indicator and, based thereon, estimate an amount of timing slack between the data signal and the clock signal of the logical gate.

2. The circuit as recited in claim 1, wherein the at least one buffer cell comprises a plurality of buffer cells, and for at least one buffer cell of the plurality of buffer cells, the additional data signal is a delayed data signal output from another buffer cell of the plurality of buffer cells.

3. The circuit as recited in claim 1, wherein each of the at least one buffer cells contains a first buffer for delaying the data signal and a second buffer for delaying the clock signal, and the first buffer and the second buffer have a same threshold voltage.

4. The circuit as recited in claim 1, wherein each of the at least one buffer cells contains a same type of flip-flop as the logical gate.

5. The circuit as recited in claim 1, wherein the at least one buffer cell comprises a plurality of buffer cells, and at least two of the buffer cells comprise a different amount of delay of the data signal than each other.

6. The circuit as recited in claim 1, wherein the circuit operates while the chip is operating in a non-test mode.

7. The circuit as recited in claim 1, wherein a frequency of the clock signal is not changed while the circuit is operating.

8. The circuit as recited in claim 1, wherein each of the at least one error circuits comprises an exclusive OR logic gate to determine whether the data error has occurred.

9. The circuit as recited in claim 1, wherein the respective data collection circuit corresponding to each buffer cell comprises a circuit implementing a respective sticky bit, and the respective error indicator for each buffer cell is a state of the respective sticky bit for each buffer cell.

10. The circuit as recited in claim 1, wherein the respective data collection circuit corresponding to each buffer cell comprises a respective accumulator circuit that accumulates determined data errors for each buffer cell, and the respective error indicator for each buffer cell is based on a value of the respective accumulator for each buffer cell.

11. The circuit as recited in claim 1, wherein the at least one buffer cell comprises a plurality of buffer cells that each delay the data signal and the clock signal, and the estimated amount of timing slack is based on a delay from the logical gate to a buffer cell of the plurality of buffer cells having minimum delay to the logical gate and for which a data error is determined.

12. The circuit as recited in claim 1, wherein the logical gate is an endpoint on the chip previously determined to be sensitive to timing slack.

13. A method of estimating timing slack on a chip, the method comprising:
  receiving, with a sensor circuit included on the chip, a data signal and a clock signal of a logical gate included on the chip;
  skewing, with at least one buffer cell of the sensor circuit, the data signal and the clock signal by delaying the data signal more than the clock signal;
  determining, for each buffer cell of the at least one buffer cell, whether a data error has occurred by comparing a delayed data signal output from the buffer cell with an additional delayed data signal that is delayed less than the delayed data signal output from the buffer cell;
  calculating, with a respective data collection circuit corresponding to each buffer cell, a respective error indicator for each buffer cell based on the determination of the data error for each buffer cell; and
  estimating an amount of timing slack between the data signal and the clock signal of the logical gate from the respective error indicator for each buffer cell.

14. The method as recited in claim 13, further comprising updating, with a voltage control feedback loop comprising the chip, a voltage on the chip based on the estimated amount of timing slack.

15. The method as recited in claim 13, further comprising updating, with a feedback control loop, a clock frequency running on the chip based on the estimated amount of timing slack.

16. The method as recited in claim 13, further comprising updating a histogram counter that maintains a statistical distribution of timing slack by accumulating numbers of times different amounts of timing slack are the estimated amount of timing slack.

17. The method as recited in claim 13, wherein the at least one buffer cell comprises a plurality of buffer cells, and each buffer cell comprises a different amount of delay than other buffer cells.

18. The method as recited in claim 13, wherein the receiving, the skewing, the determining, the calculating, and the estimating are performed while the chip is operating in a non-test mode.

19. The method as recited in claim 13, wherein an amount of delay for the at least one buffer cell is calibrated for a process used to fabricate the chip.

20. The method as recited in claim 13, wherein the at least one buffer cell comprises a plurality of buffer cells, and for at least one buffer cell, the additional delayed data signal is a delayed data signal output from another buffer cell.

21. The method as recited in claim 13, wherein the respective data collection circuit corresponding to each buffer cell comprises a circuit implementing a respective sticky bit, and the respective error indicator for each buffer cell is a state of the respective sticky bit for each buffer cell.

22. The method as recited in claim 13, wherein the at least one buffer cell comprises a plurality of buffer cells that each delay the data signal and the clock signal, and the estimated amount of timing slack is based on a delay from the logical gate to a buffer cell having minimum delay to the logical gate and for which a data error is determined.

23. The method as recited in claim 13, wherein the determining, for each buffer cell, whether the data error has occurred is done with a respective exclusive OR logic gate for each buffer cell.

24. A system comprising:
  a chip having a logical gate provided with a data signal and a clock signal;
  a plurality of buffer cells each configured to skew the data signal and the clock signal by delaying the data signal more than the clock signal;
  a plurality of error circuits each coupled to a respective one of the plurality of buffer cells configured to determine for the respective buffer cell whether a data error has occurred by comparing a delayed data signal output from the respective buffer cell with an additional data signal that is delayed less than the delayed data signal output from the respective buffer cell;
  a plurality of data collection circuits each coupled to a respective one of the plurality of error circuits configured to calculate a respective error indicator for the respective buffer cell based on the determination of the data error for the respective buffer cell; and
  a slack estimator circuit configured to receive each error indicator and based thereon estimate an amount of timing slack between the data signal and the clock signal of the logical gate.

25. The system as recited in claim 24, wherein for each respective buffer cell, other than the at least one buffer cell, the additional data signal is a delayed data signal output from a different buffer cell than the respective buffer cell.

26. The system as recited in claim 24, wherein each respective buffer cell includes a flip-flop for delaying the data signal to produce the delayed data signal output from the respective buffer cell, and the flip-flop is a same type of flip-flop as included in the logical gate.

27. The system as recited in claim 24, wherein each of the buffer cells is connected to another buffer cell by coupling a buffered data signal and a buffered clock signal between adjacent buffer cells, and to skew the data signal and the clock signal by delaying the data signal more than the clock signal comprises skewing the buffered data signal more than the buffered clock signal.

28. A device for estimating timing slack on a chip, the device comprising:
   means for receiving a data signal and a clock signal of a logical gate included on the chip;
   means for skewing the data signal and the clock signal to produce a plurality of skewed data signals;
   means for determining, for each skewed data signal, whether a data error has occurred by comparing the skewed data signal with an additional data signal that is skewed less than the skewed data signal;
   means for calculating a respective error indicator for each skewed data signal, the calculating based on the determination of the data error for each skewed data signal; and
   means for estimating an amount of timing slack between the data signal and the clock signal of the logical gate from the respective error indicator for each skewed data signal.

29. The device as recited in claim 28, wherein the means for skewing the data signal and the clock signal comprises a plurality of buffer cells, and for at least one buffer cell, the additional data signal is a skewed data signal output from another buffer cell.

30. The device as recited in claim 28, wherein the data error for each skewed data signal is determined to have occurred if the skewed data signal and the additional data signal do not match.

* * * * *